United States Patent [19]

Miller

[11] 4,140,831

[45] Feb. 20, 1979

[54] FLAME-RETARDANT METAL-CLAD DIELECTRIC SHEETING COMPRISING A NON-WOVEN FIBROUS LAYER PROVIDED WITH DIMENSIONAL STABILITY UNDER ETCHING AND SOLDERING CONDITIONS BY A POLYESTER-DIEPOXIDE ADHESIVE

[75] Inventor: Stephen A. Miller, Saint Paul, Minn.

[73] Assignee: Minnesota Mining and Manufacturing Company, St. Paul, Minn.

[21] Appl. No.: 890,470

[22] Filed: Mar. 27, 1978

Related U.S. Application Data

[63] Continuation-in-part of Ser. No. 780,279, Mar. 23, 1977, abandoned.

[51] Int. Cl.² .................. B32B 15/08; B32B 15/14; D04H 1/58
[52] U.S. Cl. .................................. 428/285; 174/68.5; 427/96; 427/97; 427/98; 427/99; 428/287; 428/288; 428/290; 428/458; 428/901
[58] Field of Search ............... 174/68.5; 428/285, 288, 428/287, 290, 297, 458, 901

[56] References Cited

U.S. PATENT DOCUMENTS

| 3,027,279 | 3/1962 | Kurka et al. | 428/324 |
|---|---|---|---|
| 3,878,316 | 4/1975 | Groff | 428/297 |
| 3,955,024 | 5/1976 | Goldman | 428/901 |
| 4,035,694 | 7/1977 | Barton et al. | 428/288 |

Primary Examiner—J.C. Cannon
Attorney, Agent, or Firm—Cruzan Alexander; Donald M. Sell; Gerald F. Chernivec

[57] ABSTRACT

Flame-retardant metal-clad dielectric sheeting useful in printed circuitry manufacture comprising an electrically conductive metallic layer adhered to a compacted dimensionally stable non-woven web by a polyester diepoxide adhesive system. The diepoxide is formed by end-capping a polyester formed from neopentyl glycol and an acid selected from the group consisting of azelaic, sebasic, and adipic acids with a moderately brominated bisphenol A-epichlorohydrin epoxy. The curing agent for the diepoxide system is a polyanhydride selected from the group consisting of polyazelaic, polyadipic, and polysebasic anhydrides.

9 Claims, No Drawings

FLAME-RETARDANT METAL-CLAD DIELECTRIC SHEETING COMPRISING A NON-WOVEN FIBROUS LAYER PROVIDED WITH DIMENSIONAL STABILITY UNDER ETCHING AND SOLDERING CONDITIONS BY A POLYESTER-DIEPOXIDE ADHESIVE

This application is a continuation-in-part of application Ser. No. 780,279, filed Mar. 23, 1977, and now abandoned.

BACKGROUND OF THE INVENTION

Some varieties of flexible electronic printed circuit backings are comprised of impregnated non-woven fibrous web materials laminated to an electrically conductive metal foil, which after suitable selective etching provides the electrical circuitry.

One such non-woven fibrous web material having particular utility herein is disclosed in commonly assigned and copending application Ser. No. 577,444, now Pat. No. 4,035,694. The web disclosed therein comprises a fiber blend of high tensile strength and heat-resistant discontinuous fibers, the fibers being compacted and held together with a matrix of film-forming polymeric binder material. The web has an extreme degree of dimensional stability during the manufacturing and subsequent processing operations of the printed circuitry.

An adhesive system is typically applied to the compacted web prior to lamination and bonding thereto of the conductive metal foil.

The adhesives used typically are thermosettable resin systems which are flexible, have high insulation resistance, are not adversely affected by molten solder temperature conditions, i.e., about 500° F., etc. Typically, such systems are latent curing to provide adequate shelf life when in a semi-cured, or B-stage condition. Furthermore, the adhesive system should afford high peel adhesion to the electrically conductive metallic foil layer.

One further criteria necessary for the dielectric sheet material is that of flame retardancy. It has been observed that when flame retardancy is desired or necessary, it has been almost impossible to achieve the combination of foregoing characteristics in addition thereto. Adhesive systems capable of providing for requisite electrical properties typically cure too fast to be suitably processable, and systems with the required latency do not meet the ultimate performance properties necessary for the sheet material. Furthermore, flame retardancy attained via bromination of the adhesive system, i.e., by simply adding a highly brominated compound thereto, has been found to considerably reduce the flexibility of the dielectric material.

It has now been found that a particularly defined epoxy/polyester adhesive system is capable of attaining the aforementioned characteristics in addition to flame retardancy.

SUMMARY OF THE INVENTION

The present invention provides a flame retardant metal-clad dielectric sheeting comprising a nonwoven web and an electrically conductive metallic layer adhered to at least one side of the web; said web comprising at least 10 pounds per ream of a fiber blend of discontinuous fibers compacted and held together with a matrix of film-forming high-molecular-weight polymeric binder material that accounts for 5 to 75 weight-percent of the web. Substantially all of the fibers in the fiber blend should generally have a softening point about 450° F. At least 5 weight-percent of the fibers resist distortion when exposed for 10 seconds to a molten solder bath heated to 500° F., at least 30 weight-percent of the fibers exhibit a tensile elongation of at least 20 percent and a tenacity of at least 3.5 grams/denier, and at least 40 weight-percent of the fibers exhibit a moisture regain of less than about 3 weight-percent (which is the amount of weight gain in a previously dried sample when the sample is exposed at 65% relative humidity and 70° F. for one day). The polymeric binder material is solid and nontacky at room temperature, at least initially softens and flows slightly under the heat and pressure of the compacting operation, and in film form is foldable upon itself without cracking and resists distortion when heated for 10 seconds on a molten solder bath heated to 500° F. The metallic layer is adhered to the web by a polyester/diepoxide adhesive system comprising a polyester formed from an acid selected from the group consisting of azelaic, adipic, and sebasic acids and neopentyl glycol and end-capped with a moderately brominated bisphenol A-epichlorohydrin epoxy; a curing agent comprising a polyanhydride selected from the group consisting of polyazelaic, polysebasic, and polyadipic anhydrides; a sufficient quantity of highly brominated epoxy resin to provide at least about 14 percent by weight bromine in said adhesive system; and about 5 percent by weight of antimony trioxide.

This metal-clad dielectric sheeting generally exhibits no more than a 2 mil/inch change in dimensions upon etch-removal of part or all of the electrically conductive layer. Further, sheeting of the invention exhibits less than a 10 mil/inch change in dimension, substantially no blistering upon exposure for 10 seconds to a solder bath heated to 450° F., and is flame retardant.

DETAILED DESCRIPTION

In general, non-woven webs used in metal-clad dielectric sheeting of the invention are prepared by first blending the desired discontinuous or staple fibers; then forming the blend into a fluffy nonwoven web, preferably by conventional air-layering processes such as Rando-webbing or garnetting; then preferably preshrinking by means of exposure to elevated temperatures via circulating air oven or infrared heating; then impregnating the web with a binder material, as by passing the web between two squeeze rolls, one of which is partially immersed in a dispersion or solution of the binder material; and finally drying and compacting the web as by passing the impregnated preshrunk web through an oven and then between heated pressure rollers (which, in the preferred embodiment, also crosslinks the binder material).

The staple fibers used in the fiber blend should have lengths that provide good tear strength and ease of web formation ("staple" fibers means discontinuous fibers). Rando-webbing, garnetting or equivalent air-laying processes are generally convenient to use with staple fibers longer than about 0.3 centimeter and preferably longer than 1.5 centimeters. Fibers longer than about 8 or 10 centimeters are generally not used, even on a garnett machine. It is preferred that the discontinuous or staple fibers of the invention be fibers having filament diameters corresponding to 0.5 to 20 denier, preferably less than 10 denier. The fibers should be included in an amount of at least 10 pounds per ream, and preferably in an amount of 20 pounds per ream to provide adequate tear strength to the backing, although the weight will vary somewhat depending on the amount and type of high-strength fiber used.

High-temperature-resistant fibers are important to the dimensional stability of dielectric sheeting of the invention. Temperature resistance can be measured by observing fibers laid on the surface of a molten solder bath heated to 500° F. for 10 seconds. Fibers that show a significant distortion (such as polyethylene terephthalate fibers, which curl into a ball in this test) do not have sufficient heat-resistance, and dielectric sheeting made completely from such fibers will not have the needed dimensional stability.

Even a small proportion of high-temperature-resistant fibers, which show little if any distortion in the described solder bath test, will greatly improve the dimensional stability of the dielectric sheeting. Apparently the distribution of high-temperature-resistant fibers through the fiber blend, so that high-temperature-resistant fibers contact the non-high-temperature-resistant fibers, together with the presence of the non-high-temperature-resistant fibers in a matrix of high-temperature-resistant binder material, achieves good dimensional stability. As little high-temperature-resistant fiber as 5 weight-percent of the fiber blend will achieve good dimensional stability, though preferably at least 10 weight-percent high-temperature-resistant fibers are used.

Preferred high-temperature-resistant fibers used in the non-woven webs of sheeting of the invention are from the class of aromatic polyamides, such as described in Hill et al, U.S. Pat. No. 3,094,511 and Clay, U.S. Pat. No. 3,300,450. Users of printed circuitry of the invention often desire temperatures of 500 to 550° F. in their molten solder baths, and sheeting based on aromatic polyamides has been found to provide the best dimensional stability at such temperatures. These aromatic polyamides have the formula:

$(-NR_1-Ar_1-NR_1-CO-Ar_2-CO-)_n$, in which $R_1$ is hydrogen or lower alkyl, and $Ar_1$ and $Ar_2$ are divalent aromatic radicals. Among the preferred polymers are those in which $R_1$ is hydrogen and Ar is a meta- or para-phenylene radical. These preferred polymers substantially maintain their physical properties to temperatures about 600° F. and do not melt (but degrade) above about 700° F. The index of polymerization ("n") should be high enough to provide high molecular weights used in spun filaments. An especially preferred commercial material is the "Nomex" Brand material made by DuPont, believed to principally comprise poly(m-phenylene-isophthalamide).

Another useful class of high-temperature-resistant fibers is the class of acrylic fibers, preferably those that are homopolymers of acrylonitrile, but also including copolymers of acrylonitrile (which generally include at least 85 weight-percent acrylonitrile) and any additional monomer that does not detract from the high-temperature-resistant properties of the fibers. Glass fibers in forms which can be handled on air-laying equipment are another useful high-temperature-resistant fiber.

Additionally, to provide strength to the web, at least 30 percent of the fibers should exhibit a tensile elongation of at least 20 percent and a tenacity of at least 3.5 grams/denier. Preferred tough high-tensile-strength fibers, capable of providing the elongation and tenacity requirements, are polyester fibers of the formula

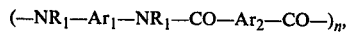
$(-O-A-O-CO-Ar-CO-)_n$, where A is a divalent straight-chain or cyclic aliphatic radical, Ar is a divalent aromatic radical, for example, meta-phenylene and n is the index of polymerization. These polyesters are prepared in a known manner from difunctional alcohols — for example, ethylene glycol and 1,4-cyclohexanedimethanol —, and difunctional carboxylic acids (or esters thereof) — for example, terephthalic acid, isophthalic acid, and mixtures thereof. For best strength properties, the fibers are drawn, that is, stretched or oriented, causing them to be crystalline in structure.

The aromatic polyamide fibers described above are also often tough, high-strength fibers, as are nylon fibers.

General ranges for the amounts of fibers as listed above in non-woven webs used in the invention are as follows: for drawn polyester fibers, 30–95 weight-percent, preferably at least 50 weight-percent, and more preferably at least 70 weight-percent; for aromatic polyamide fibers, 5–60 weight-percent, and preferably 10–30 weight-percent; and for acrylic fibers, up to 70 weight-percent, and preferably up to 40 weight-percent.

Furthermore, at least 40 percent by weight of the fibers should exhibit a moisture regain of less than about 3 percent by weight. (This is the amount of weight gain in a previously dried sample when the sample is exposed to 65 percent relative humidity at 70° F. for one day.)

The useful binder materials by which non-woven fibrous webs or backings of the invention are compacted and held together are generally film-forming, high-molecular-weight, high-temperature-resistant (i.e., they resist distortions when exposed for 10 seconds while in film form to a molten solder bath heated to 500° F.) materials, and they preferably react to a crosslinked or thermoset condition. They should be solid and non-tacky at room temperature, so that they will hold a fiber blend in a compacted form and so that a compacted web can be laid against another compacted web without tacking the webs together. The useful polymeric binder materials at least initially soften and flow slightly under the heat and pressure of the compacting operation, whereby they fully impregnate the web without flowing freely out of the web; and they retain the web in compacted form immediately after the compacting pressure is released. The polymeric binder materials are also sufficiently flexible so that, when in film form, they can be folded on themselves without cracking. The binder materials should also not absorb undue amounts of moisture, that is, they preferably exhibit a moisture regain of less than about 3 percent when in film form (after crosslinking, if they are reactive).

Particularly useful polymeric binder materials are reactive acrylic-based resins, generally comprising copolymers having a major portion of lower-alkyl (generally one to eight carbon atoms) esters of acrylic or methacrylic acid, such as ethyl acrylate, butyl acrylate and 2-ethyl hexyl acrylate, and a minor portion of acrylic or methacrylic acid. Polyurethane binder materials may also be used. Other Useful binder materials are thermoplastic polymers, such as polymers based on vinyl chloride (such as the "Vinylon" brand resins from Union Carbide).

The binder material is generally included in non woven fibrous webs in sheeting of the invention in an amount between 5 and 75 weight-percent of the backing, and preferably in an amount less than 35 weight-percent of the backing. Non-woven fibrous webs useful in the invention are generally rather flexible, as flexible as a 10-mil thick biaxially oriented polyethylene terephthalate film, for example. The webs are usually less than 20 mils in thickness.

An adhesive system is typically applied to the compacted web prior to lamination of the metallic foil thereto, to insure satisfactory bonding of the foil to the web. To impart flame retardancy to the system, it has been proposed that halogenation of the adhesive system be undertaken. However, it has been found that the halogen of the system can cause a reduction in desired physical properties and a loss of adhesion of the foil to the web. To overcome this reduction in adhesion, in some instances a halogenated system is applied as a base coat to the web, while a non-halogenated version is later applied over this base coat.

To achieve adequate flame retardancy through halogenation coupled with the synergistic effect of antimony trioxide, it has been ascertained that at least about 14 percent by weight of the adhesive must be halogen, or more specifically, bromine in the instant case. To simply add high bromine content materials to the adhesive system, however, would sacrifice flexibility of the cured adhesive.

Such problems can be avoided by use of a particular polyester diepoxide adhesive and a particular class of curing agents. The polyester is conventionally formed by the reaction of azelaic, sebasic, or adipic acid and neopentyl glycol. While concentration of the reactants is not critical, optimum properties are obtained with a weight ratio of about 1.5:1 of the acid of the glycol. The plyester is then end capped in conventional fashion with a moderately brominated, i.e., about 18 to 20 percent by weight bromine, bisphenol A-epichlorohydrin epoxy.

When this particular polyester/diepoxide is cured with polyazelaic, polyadipic, or polysebasic polyanhydride as the curing agent, it is found that an adhesive meeting the foregoing criteria is provided. The range of anhydride equivalence to epoxide equivalent should be maintained at from about 0.85 to 1 to about 1.2 to 1, and preferably at 1.0 to 1, for satisfactory performance. Decreasing anhydride concentration, i.e., below about 0.85 to 1 may provide insufficient cure of the adhesive, thereby reducing flexibility, while increasing anhydride concentration, i.e., above about 1.2 to 1, tends to cause the cured adhesive to be excessively plasticized, thereby reducing the solvent resistance thereof.

Other components may be added to optimize particular desired properties. Sufficient highly brominated epoxy resin should be included to afford at least about 14 percent solids to be bromine. Furthermore, about 5 percent by weight solids should be antimony trioxide, which has a synergistic effect on halogens to maintain flame retardancy. Other components, e.g., epoxy resins, known for their film forming or solvent resistant properties can be conveniently included. However, such resins must be of sufficiently low molecular weight to avoid incompatibility with the polyanhydride, i.e., gellation of the system may occur at room temperatures. It would appear that a practical limit for the molecular weight of such epoxy resins is approximately 12,000.

Suitable conductive layers include foils of copper, aluminum, nickel, silver, gold, or suitable transition metals. The thickness of the metal foil is usually on the order of 0.02 to 0.05 millimeter. Conductive layers can also be provided in a laminate of the invention by electroless plating processes. Usually dielectric sheeting of the invention includes an electrically conductive metal layer on both sides of the non-woven web. Other products include an electrically conductive metal layer on only one side of the web, such products often including a preformed polymeric film on the other side of the web.

The invention will be further and more specifically illustrated by the following nonlimiting examples, wherein all parts are by weight unless otherwise specified.

EXAMPLE 1

A mixture of 1135.8 grams of azelaic acid, 437.4 grams of neopentyl glycol, 1.05 grams potassium acetate catalyst and 180 grams of heptane were placed in a reaction vessel and stirred and heated under nitrogen to a temperature of 212° C., while water formed during the reaction was codistilled with heptane. When evolution of water ceased and all heptane had been distilled, 50 grams of toluol were added to the reaction vessel and a vacuum of 15 mm mercury was applied for 15 minutes.

The resulting polyester had an acid number of 152.6 corresponding to an acid equivalent weight of 367.6, and contained an average of 2 carboxyl groups per molecule.

A mixture of 334.06 grams (.909 acid equivalent weights) of the above polyester, and 1115.95 grams (1.818 epoxide equivalent weights) of DER 511A80, tradename for an 80 percent by weight solids in acetone of a moderately brominated (18–20% by weight bromine) epichlorohydrin-bis-phenol A epoxy resin having an average epoxide equivalent weight of 614, were heated to 150° C. with stirring for 1.5 hours. During this heating the acetone solvent was distilled from the mixture and the final epoxide equivalent weight was found to be about 1400. When the solution had cooled to 100° C., 306.7 grams of toluol were added with stirring to produce a viscous resin with a solids content of 80 weight percent.

This adduct was then mixed in the following formulation:

| Component | Parts by Weight |
|---|---|
| Polyester/epoxy resin adduct | 114.9 |
| EPI-REZ 2392 (tradename for a 42% by weight bromine-containing epoxy resin commercially available from the Celanese Corp.) | 68.0 |
| EPON-828/Sb$_2$O$_3$ (1 part to 1 part, 3 roll milled) | 20.0 |
| EPON 1010 (50 weight percent in a 1:1 by volume methyl ethyl ketone/toluol; EPON 1010 is an epichlorohydrin-bisphenol A epoxy resin of 8000-12000 molecular weight commercially available from the Shell Chemical Co.) | 30.0 |
| DEN 438 (tradename for a trifunctional novolac epoxy resin commercially available from the Dow Chemical Co.) | 3.0 |
| Methyl ethyl ketone | 5.0 |
| Toluol | 20.0 |
| Polyazelaic polyanhydride | 80.3 |

The polyazelaic polyanhydride was added as a 50 weight percent solution in toluol, which was prepared by heating the solution to 70° C., with stirring. The composition contained an anhydride:epoxide equivalence of 1:1.

The EPON 1010 provides film-forming properties, i.e., solvent resistance to the cured resin system.

The following fiber mixture was then opened and blended together on a fiber blender:

| Component | Parts by Weight |
| --- | --- |
| Poly(m-phenylene isophthalamide)staple fibers, 1.5 denier × 2.0 inches (5.08 cm) ("Nomex" aromatic polyamide fibers from duPont) | 20 |
| Drawn polyethylene terephthalate staple fibers, 6 denier × 1.5 inches (3.81 cm) exhibiting a tensile elongation of about 44 percent and a tenacity of about 4.4 grams/denier ("Celanese Type 400" fibers) | 80 |

The well-blended mixture was then formed into a web on a "Rando-Webber" machine at a speed of about 12 feet per minute (3.6 meters/second). The web, which was fluffy and had a height of about 0.25 inch, was then passed between two horizontally aligned squeeze rolls where the polymeric binder material was added. The binder material was a copolymer believed to contain a large proportion of an acrylic or methacrylic ester such as ethyl acrylate and acrylic acid together with a crosslinking agent such as hexamethoxymethyl melamine (Rhoplex AC 172 from Rohm & Haas Co.). This binder material was dispersed in water as an emulsion. The bottom one of the two squeeze rolls was located in a trough containing the emulsion and carried the emulsion to the web; and part of the emulsion was pumped onto the top of the squeeze rolls. The impregnated web traveled through an oven where it was dried at 250° F., and then between rubber and steel rolls heated to 400° F., where it was densified to a thickness of about 3.5 mils. The weight of the resulting porous, dense, tough web was 26 pounds per ream.

The raw web thus produced was then roll-coated on two passes with the epoxy/polyester composition. The resulting coating had a dry thickness of about 3 mils (0.076 mm). This coating was dried and B-staged for 20 minutes at 220° F. (104° C.). One ounce per square foot (0.03 grams per square centimeter) Treatment TC copper sheeting (Gould Corporation) was then laminated to each side of the web in pressure rolls heated to 280° F. (138° C.); one roll was steel and the other was rubber. After laminating, the coating was cured 30 minutes at 400° F. (205° C). The resulting flat, clad laminate was flexible and had an overall thickness of about 9 mils (22.5 mm). The copper was found to be securely bonded to the backing.

The resulting metal-clad dielectric sheeting was then tested for distortion using 3-inch-by-3-inch samples of the sheeting (7.62 centimeters by 7.62 centimeters). One sample was immersed in a solution of ammonium persulfate etchant to remove the copper layers from the sample, and then was dried for 30 minutes at room temperature. This etched sample was then first heated in an oven for 30 minutes at 250° F. (121° C.) to simulate typical printed-circuit processing steps, and then was immersed for 10 seconds in a bath of tin-lead solder maintained at 500° F. After each of the etching and heating steps, the dimensions of the sample were measured. After etch-removal, it was found that the tested sample had shrunk 0.1 percent in length; after the 250° F. heating, the sample had shrunk 0.3 percent in length from its original dimensions; and after the 500° F. heating step the sample had shrunk about 1 percent from its original dimensions.

Another sample of the metal-clad sheeting of this example was tested for solder blistering by first conditioning the sample with controlled humidity conditions (exposure for 24 hours in a chamber heated to 70° F. ± 2° F. and having a relative humidity of 50% ± 5%) and then immersing the conditioned sample for 10 seconds in a bath of molten tin-lead solder maintained at 450° F. or 500° F. Any blistering which occurred would have been caused by escaping moisture, which puffs up or otherwise delaminates the copper, but no blistering was observed.

Additional samples were tested for flammability per ASTM D-568 and D-2863 and were considered satisfactory.

EXAMPLE 2

A mixture of 840.4 grams of azelaic acid, 277.4 grams of neopentyl glycol, 0.75 gram potassium acetate catalyst and 180 grams of heptane were placed in a reaction vessel and stirred and heated under nitrogen to a temperature of 212° C., while water formed during the reaction was codistilled with heptane. When evolution of water ceased and all heptane had been distilled, a vacuum of 15 mm mercury was applied for 15 minutes.

A mixture of 512 grams (2.0 acid equivalent weights) of the above polyester, 1228 grams (2.0 epoxide equivalent weights) of DER 511 A80, tradename for a brominated (18–20% Br) epichlorohydrin-bisphenol A epoxy resin having an average epoxide equivalent weight of 614 and 640.8 (3.8 epoxide equivalent weights) of DEN 438, tradename for a novolac epoxy having an average epoxide equivalent weight of 178, were heated to 150° C. with stirring for 1.5 hours. During this heating the acetone solvent was distilled from the mixture and the final epoxide equivalent weight was found to be 573.

When the solution had cooled to 100° C., 533.8 grams of toluol were added with stirring to produce a viscous resin with a solids content of 80 weight percent This adduct was then mixed in the following formulation:

| Component | Parts by Weight |
| --- | --- |
| Polyester/epoxy resin adduct | 114.9 |
| EPI-REZ 2392 | 68.0 |
| EPON-828/Sb$_2$O$_3$ (1 part to 1 part, 3 roll milled) | 17.0 |
| Methyl ethyl ketone | 5.0 |
| Toluol | 10.0 |
| Polyazelaic polyanhydride | 104.1 |

The resulting polyester had an acid number of 199.4 corresponding to an acid equivalent weight of 256.

The polyazelaic anhydride was added as a 50 weight percent solution in toluol, which was prepared by heating the solution to 70° C. with stirring. The composition contained an anhydride:epoxide equivalent of 1:1.

When the composition was utilized and tested with the web of Example 1, similar results were obtained.

When polysebasic and polyadipic polyanhydrides were substituted for the polyazelaic anhydride of the foregoing examples, similar properties were obtained. The same was true when adipic and sebasic acids were substituted for azelaic acid in the polyester formulation.

What is claimed is:

1. Metal-clad dielectric sheeting useful in the manufacture of printed circuitry comprising a non-woven web and an electrically conductive metallic layer adhered to at least one surface of said web by an adhesive system; said web comprising at least 10 pounds per ream of a fiber blend that comprises high tensile strength and heat resistant discontinuous fibers compacted and held together with a matrix of film-forming binder composition that accounts for about 5 to about 75 weight percent of the web; wherein substantially all of said fibers have a softening point above 450° F.; and wherein at least 5 weight percent of the fibers resist distortion when exposed for 10 seconds to a molten solder bath heated to 500° F., at least 30 weight percent of the fibers exhibiting a tensile elongation of at least 20% and a tenacity of at least 3.5 grams per denier, and at least 40 weight percent of the fibers exhibiting a moisture regain of less than about 3 weight percent; said adhesive system comprising a polyester diepoxide comprising a polyester formed from an acid selected from the group consisting of sebasic adipic, and azelaic acids and neopentyl glycol which is end-capped with a moderately brominated bisphenol A-epichlorohydrin epoxy resin; sufficient highly brominated epoxy resin to provide at least about 14 percent by weight solids bromine in said adhesive system, about 5.0 percent by weight solids antimony trioxide, and sufficient polyanhydride curing agent, selected from the group consisting of polyazelaic, polysebasic, and polyadipic polyanhydrides, to provide an anhydride equivalence to epoxide equivalence in said adhesive system of from about 0.85 to about 1.2 to 1; said metal-clad dielectric sheeting exhibiting no more than a 2-mil per inch change in dimensions upon etch-removal of part or all of the electrically conductive layer, and exhibiting no more than a 10 mil per inch change in dimensions and substantially no blistering when exposed for 10 seconds to a molten solder bath heated to 450° F.

2. The dielectric sheeting of claim 1 wherein said adhesive system further includes an epoxy resin having a molecular weight of less than about 12,000.

3. Sheeting of claim 1 in which between 30 and 95 weight-percent of the fiber blend is drawn polyester fibers, between 5 and 60 weight-percent of the fiber blend is aromatic polyamide fibers that resist distortion when exposed for 10 seconds to a molten solder bath heated to 500° F., and up to 70 weight-percent of the fiber blend is acrylic fibers that resist distortion when exposed for 10 seconds to a molten solder bath heated to 500° F.

4. Sheeting of claim 3 in which said aromatic polyamide fibers comprise poly(p-phenylene terephthalamide) fibers.

5. Sheeting of claim 3 in which about 80 weight-percent of the fiber blend is said drawn polyester fibers and about 20 weight-percent of the fiber blend is said aromatic polyamide staple fibers.

6. Sheeting of claim 1 in which said polymeric binder material comprises an acrylic-based binder material.

7. Sheeting of claim 1 in which said polymeric binder material is crosslinked.

8. Sheeting of claim 1 in which the conductive layer comprises copper.

9. A non-woven web useful as a dielectric backing for flexible printed circuitry comprising a fiber blend that comprises high tensile-strength and heat-resistant discontinuous staple fibers that substantially all have a softening point above 450° F. compacted and held together with a crosslinked film-forming polymeric binder material; said web having a layer of adhesive on at least one surface thereof, said adhesive comprising a polyester diepoxide; said polyester diepoxide comprising a polyester formed from an acid selected from the group consisting of azelaic, adipic, and sebasic acids and neopentyl glycol, which is end-capped with a moderately borminated bisphenol A-epichlorohydrin epoxy resin; sufficient highly borminated epoxy resin to provide at least about 14 percent by weight solids bromine in said adhesive, about 5.0 percent by weight solids antimony trioxide, and sufficient polyanhydride curing agent, selected from the group consisting of polyazelaic, polyadipic, and polysebasic acids, to provide an anhydride equivalence to epoxide equivalence in said adhesive of from about 0.85 to about 1.2 to 1; the fibers being present in an amount of at least 10 pounds per ream and the binder material being present in an amount of 5 to 75 weight-percent of the web; between 30 and 95 weight-percent of the fiber blend being drawn polyester fibers, between 5 and 60 weight-percent of the fiber blend being aromatic polyamide staple fibers, and up to 70 weight-percent of the fiber blend being acrylic fibers; both the aromatic polyamide and acrylic fibers resisting distortion when exposed for 10 seconds to a molten solder bath heated to 500° F.; the polymeric binder material being solid and nontacky at room temperature, at least initially softening and flowing slightly under the heat and pressure of the compacting operation, and in film form being foldable upon itself without cracking and resisting distortion when heated for 10 seconds in a molten solder bath heated to 500° F.; and the web upon lamination to an electrically conductive metallic layer forming a metal-clad dielectric sheeting that exhibits less than a 2 mil per inch change in dimensions upon etch-removal of part or all of the electrically conductive layer, and less than a 10 mil per inch change in dimensions and substantially no blistering when exposed for 10 seconds to a molten solder bath heated to 450° F.

* * * * *